United States Patent
Kim et al.

(10) Patent No.: US 10,930,880 B2
(45) Date of Patent: Feb. 23, 2021

(54) DISPLAY DEVICE

(71) Applicant: SAMSUNG DISPLAY CO., LTD., Yongin-si (KR)

(72) Inventors: Kyongjun Kim, Yongin-si (KR); Sungsik Yun, Yongin-si (KR); Juyeon Seo, Yongin-si (KR); Kyongtae Park, Yongin-si (KR); Sungho Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/717,332

(22) Filed: Dec. 17, 2019

(65) Prior Publication Data

US 2020/0388784 A1    Dec. 10, 2020

(30) Foreign Application Priority Data

Jun. 5, 2019   (KR) .................. 10-2019-0066877

(51) Int. Cl.
  *H01L 51/52* (2006.01)
  *H01L 27/32* (2006.01)
  *H01L 51/56* (2006.01)

(52) U.S. Cl.
  CPC ........ *H01L 51/5237* (2013.01); *H01L 27/326* (2013.01); *H01L 27/3276* (2013.01); *H01L 51/56* (2013.01); *H01L 2227/323* (2013.01); *H01L 2251/5338* (2013.01)

(58) Field of Classification Search
  CPC ............ H01L 51/5237; H01L 27/3276; H01L 27/326; H01L 51/56; H01L 2227/323; H01L 2251/5338
  See application file for complete search history.

(56) References Cited

U.S. PATENT DOCUMENTS

| | | | |
|---|---|---|---|
| 10,247,971 B2 | 4/2019 | Kwon et al. | |
| 2017/0229527 A1* | 8/2017 | Baek | H01L 27/3276 |
| 2017/0262109 A1* | 9/2017 | Choi | H01L 51/56 |
| 2017/0277288 A1* | 9/2017 | Choi | H01L 27/323 |
| 2018/0145124 A1 | 5/2018 | Kim et al. | |
| 2018/0204901 A1 | 7/2018 | Hwang et al. | |
| 2018/0315809 A1* | 11/2018 | Kim | H01L 27/1218 |
| 2019/0012031 A1 | 1/2019 | Kim et al. | |
| 2019/0334105 A1* | 10/2019 | Choi | H01L 51/56 |

FOREIGN PATENT DOCUMENTS

| | | |
|---|---|---|
| CN | 109148532 A | 1/2019 |
| KR | 1020140103025 A | 8/2014 |
| KR | 1020180058165 A | 5/2018 |
| KR | 1020180085398 A | 7/2018 |

* cited by examiner

*Primary Examiner* — Victor A Mandala
(74) *Attorney, Agent, or Firm* — Cantor Colburn LLP

(57) ABSTRACT

A display device includes a substrate including a display area and a peripheral area outside the display area, where the peripheral area includes a bending area and the bending area bent around a bending axis; an inorganic material layer disposed on the substrate and having a trench corresponding to the bending area and; a construction member disposed in the trench of the inorganic material layer; a first organic material layer covering the construction member; and a conductive layer disposed on the first organic material layer.

19 Claims, 16 Drawing Sheets

DISPLAY DEVICE

This application claims priority to Korean Patent Application No. 10-2019-0066877, filed on Jun. 5, 2019, and all the benefits accruing therefrom under 35 U.S.C. § 119, the content of which in its entirety is herein incorporated by reference.

BACKGROUND

1. Field

One or more embodiments relate to a display device.

2. Description of Related Art

Recently, use of display devices has been diversified. In addition, as the display devices become thinner and lighter, the range of use of the display devices is expanding. Recently, display devices, in which at least a portion thereof is bent to improve the visibility at various angles or reduce the area of a non-display area, are widely used.

SUMMARY

One or more embodiments include a display device that has a long life span and minimizes the occurrence of defects such as snapping of a wire during a manufacturing process to solve a problem that the defects occur or a life span of the display device is reduced in a process of manufacturing a bent display device.

According to an embodiment, a display device includes a substrate including a display area and a peripheral area outside the display area, where the peripheral area includes a bending area bent around a bending axis; an inorganic material layer disposed on the substrate and having a trench corresponding to the bending area and; a construction member disposed in the trench of the inorganic material layer; a first organic material layer covering the construction member; and a conductive layer disposed on the first organic material layer.

In an embodiment, the construction member may be insulated from the conductive layer.

In an embodiment, the construction member may have a board shape corresponding to the trench of the inorganic material layer.

In an embodiment, the construction member may include a plurality of patterns each having a line shape extending in a first direction parallel to the bending axis and apart from each other in a second direction perpendicular to the first direction.

In an embodiment, the construction member may include a plurality of patterns each having a line shape extending in a second direction perpendicular to a first direction parallel to the bending axis and apart from each other in the first direction.

In an embodiment, the construction member may include a plurality of patterns apart from each other in a first direction parallel to the bending axis and apart from each other in a second direction perpendicular to the first direction.

In an embodiment, the construction member may include a same material as a data line disposed in the display area and the conductive layer may include a same material as a power supply voltage line disposed in the display area.

In an embodiment, the display device may further include a second conductive layer and a third conductive layer, which are disposed on the inorganic material layer in the peripheral area and separated from each other by the trench of the inorganic material layer.

In an embodiment, the conductive layer may be connected to the second conductive layer and the third conductive layer.

In an embodiment, an upper surface of the first organic material layer may have a concave-and-convex shape.

In an embodiment, upper and bottom surfaces of the conductive layer may have concave-and-convex shapes.

In an embodiment, the display device may further include a second organic material layer covering the conductive layer.

According to an embodiment, a display device includes a substrate including a first area in which a pixel is disposed, a second area in which a driving unit is disposed, and a bending area between the first area and the second area; an inorganic material layer disposed on the substrate in the bending area; a construction member disposed on the inorganic material layer; a first organic material layer covering the construction member; and a conductive layer disposed on the first organic material layer and extending from the first area to the second area through the bending area.

In an embodiment, the construction member may have a board shape corresponding to the bending area.

In an embodiment, the construction member may extend in a second direction perpendicular to a first direction in which the conductive layer extends and include a plurality of patterns apart from each other in the first direction.

In an embodiment, the construction member may extend in a first direction in which the conductive layer extends and include a plurality of patterns apart from each other in a second direction perpendicular to the first direction.

In an embodiment, the construction member may include a plurality of patterns apart from each other in a first direction in which the conductive layer extends and apart from each other in a second direction perpendicular to the first direction.

In an embodiment, an upper surface of the first organic material layer may have a concave-and-convex shape.

In an embodiment, upper and bottom surfaces of the conductive layer may have concave-and-convex shapes.

In an embodiment, the display device may further include a second organic material layer covering the conductive layer.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
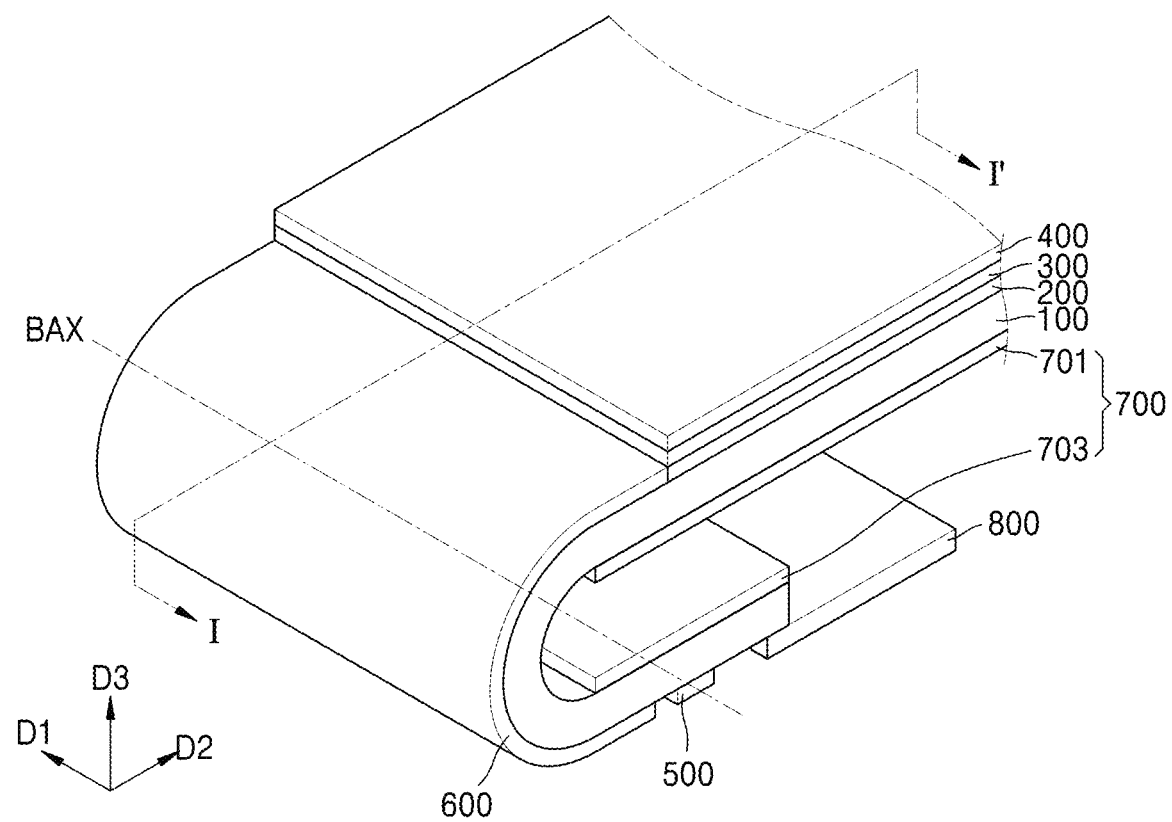
FIG. 1 is a schematic perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Expressions such as "at least one of," when preceding a list of elements, modify the entire list of elements and do not modify the individual elements of the list.

Like reference numerals in the drawings denote like elements, and thus repetitive detailed description thereof will be omitted or simplified.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It is to be understood that the terms such as "including," "having," and "comprising" are intended to indicate the existence of the features or elements, and are not intended to preclude the possibility that one or more other features or elements may exist or may be added. In addition, in the present disclosure, it is to be understood that the terms such as "including," "having," and "comprising" are intended to indicate the existence of the features or elements, and are not intended to preclude the possibility that one or more other features or elements may exist or may be added.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated for convenience of explanation. In other words, since sizes and thicknesses of elements in the drawings are arbitrarily illustrated for convenience of explanation, the following embodiments are not limited thereto. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following disclosure, it will be understood that when a wire is referred to as "extending in a first direction or a second direction", it can not only extend in a linear shape, but also can extend in the first direction or the second direction in a zigzag or curved shape.

In the following disclosure, a "plan view" indicates that a portion of a target object is seen from above, and a "cross-sectional view" indicates that a portion of a target object is vertically cut and the cross-section is viewed from the side. In the following disclosure, a term "overlapping" includes overlapping in a plan view and a cross-sectional view.

Hereinafter, embodiments of the disclosure will now be described in detail with reference to the accompanying drawings.

Figure 2:
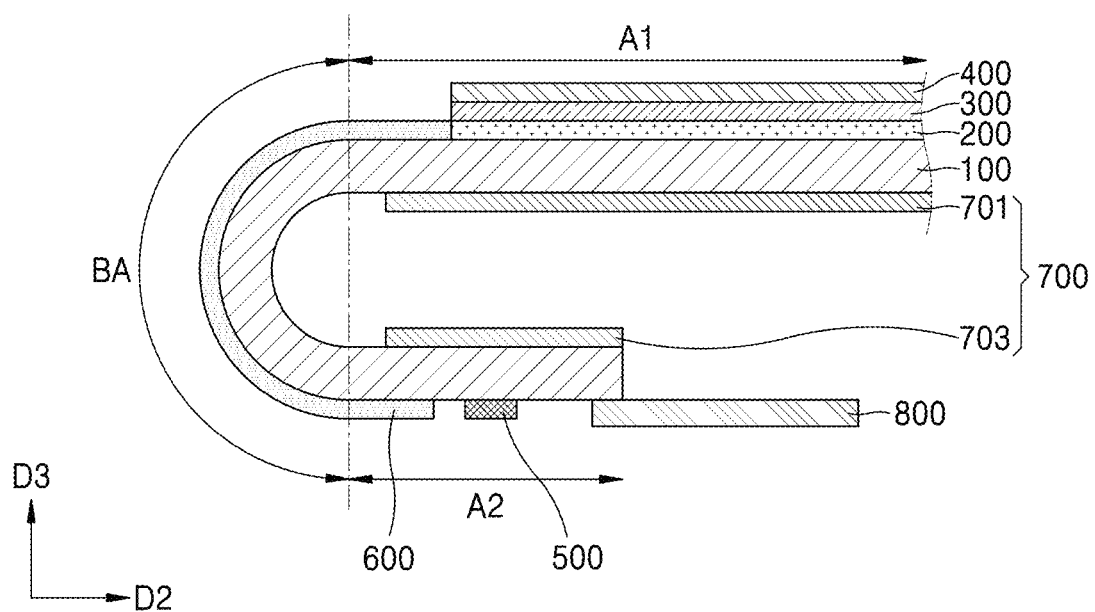
FIG. 2 is a schematic cross-sectional view of the display device in FIG. 1 taken along line I-I'.
Figure 3:
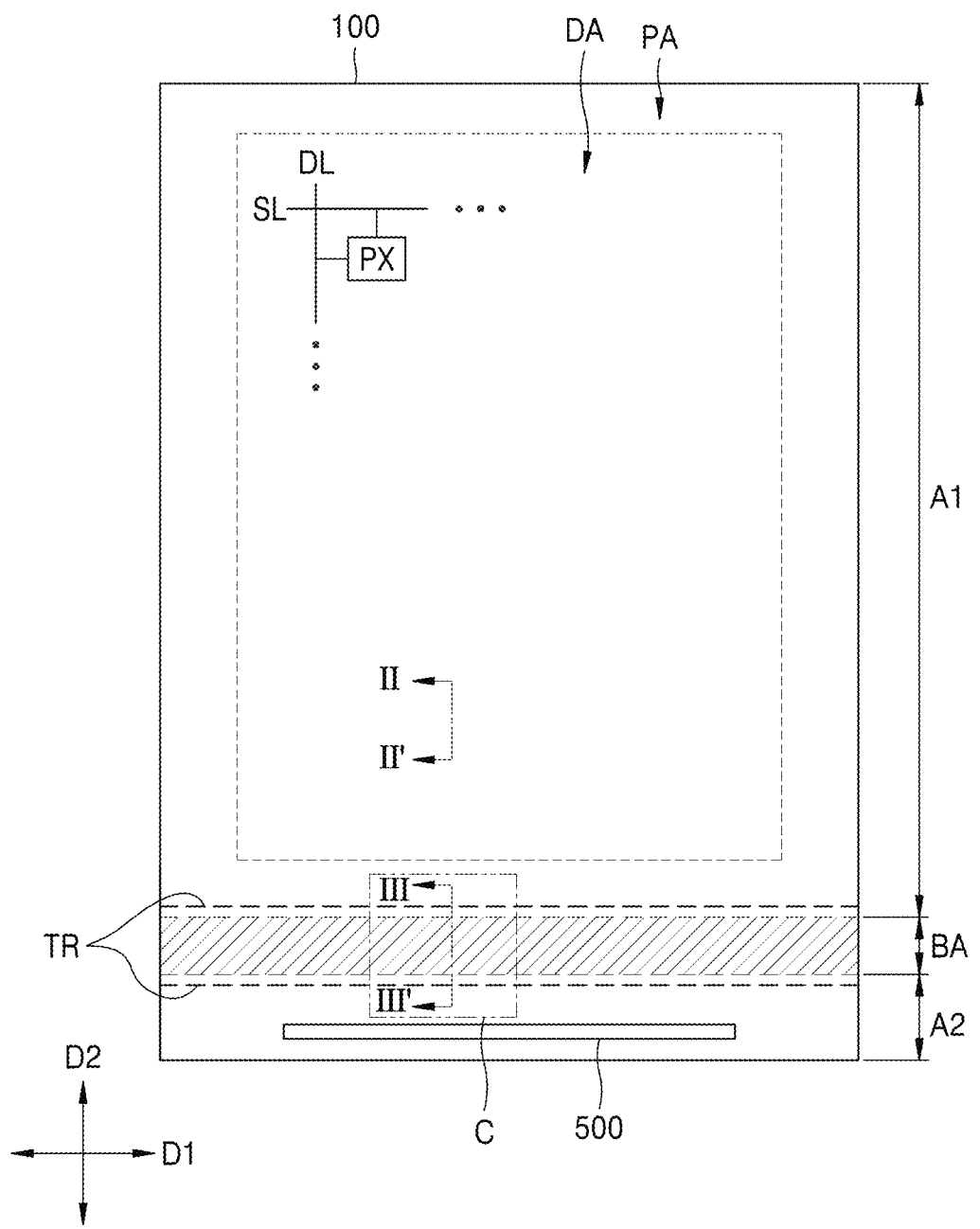
FIG. 3 is a schematic plan view of a portion of the display device in FIG. 1 before being bent.

FIG. 1 is a schematic perspective view of a display device according to an embodiment. FIG. 2 is a schematic cross-sectional view of the display device in FIG. 1 taken along line I-I'. FIG. 3 is a schematic plan view of a portion of the display device in FIG. 1 before being bent.

An embodiment of the display device may include an electronic device such as a smartphone, a mobile phone, a navigation device, a game device, a television ("TV"), a head unit for car, a notebook computer, a laptop computer, a tablet computer, a personal media play ("PMP"), a personal digital assistant ("FDA"), or the like. In such an embodiment, the electronic device may include a flexible device.

In an embodiment of the display device, as shown in FIGS. 1 and 2, a portion of a substrate 100, which is a portion of the display device, is bent such that a portion of the display device may have a bent shape like the substrate 100. However, for convenience of description, some drawings such as FIG. 3 illustrate that the display device is not bent. For convenience of illustration and description, the display device is shown as not being bent in the cross-sectional views and plan views of one or more embodiments to be described below.

Referring to FIGS. 1 to 3, an embodiment of the display device may include the substrate 100 having a first area A1, a second area A2, and a bending area BA between the first area A1 and the second area A2. The display device may include a display member 200, a sensing member 300, and a polarizing member 400 which are located in the first area A1 of the substrate 100, and a driving unit 500 located in the second area of the substrate 100. Although not illustrated in FIGS. 1 to 3, a window may be attached to an upper portion of the polarizing member 400. The window may extend not only to a display area DA but also to a peripheral area PA including the bending area BA. Accordingly, the window may protect the bending area BA from an external impact.

The first area A1 may include the display area DA and the peripheral area PA which a non-display area surrounding the display area DA. The second area A2 may also include the peripheral area PA.

The substrate 100 may have a bending area BA extending in a first direction D1. The bending area BA may be included in the peripheral area PA. The bending area BA may be between the first area A1 and the second area A2 in a second direction D2 which intersects the first direction D1. Here, a third direction D3 is a direction perpendicular to the first and second directions D1 and D2 or a thickness direction of the substrate 100. In an embodiment, as shown in FIG. 1, the substrate 100 is bent around a bending axis BAX extending in the first direction D1. A trench TR of an inorganic insulating layer IL (see FIGS. 5A to 5C) may be provided or defined in the peripheral area PA along the first direction of the bending area BA.

The substrate 100 may include at least one of various materials having flexible or bendable characteristics. In one embodiment, for example, the substrate 100 may include a polymer resin such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), and cellulose acetate propionate ("CAP").

The display member 200 for displaying an image may be located in the display area DA of the first area A1. The display member 200 may include a plurality of pixels, and each of the pixels PX may include a display element and a pixel circuit including a thin-film transistor for controlling light emission of the display element, or the like. Each of the pixels PX may be connected to a scan line SL and a data line DL as shown in FIG. 3. The display element may include, for example, an organic light-emitting element and/or a liquid crystal element. The display member 200 may include a display panel including an encapsulation member. In an embodiment, the encapsulation member may include an encapsulation substrate and a sealant for coupling the substrate 100 to the encapsulation substrate. In an alternative embodiment, the encapsulation member may include an encapsulation layer. The encapsulation layer may include an inorganic encapsulation layer and an organic encapsulation layer. The encapsulation layer may supplement the characteristics of the display element which may be vulnerable to oxygen and moisture by blocking and encapsulating the organic light-emitting element from an outside.

The sensing member 300 may be provided or disposed on the display member 200. The sensing member 300 may obtain coordinate information of an input spot by sensing external touch information to output an input signal corresponding thereto. The sensing member 300 may include a sensing electrode (or touch electrode) and a trace line connected to the sensing electrode. The sensing member 300 may sense an external input in a mutual-capacitance method and/or a self-capacitance method.

The sensing member 300 may be provided or formed directly on the display member 200 to be built-in or may be disposed or mounted on the display member 200 as a separate unit. In one embodiment, for example, the sensing member 300 may be formed continuously after a process of forming the display member 200. In such an embodiment, the sensing member 300 may be a portion of the display member 200 and an adhesive layer may not be between the sensing member 300 and the display member 200. Alternatively, the sensing member 300 may be coupled to the display member 200 through the adhesive layer. Although FIG. 1 illustrates an embodiment where the sensing member 300 is between the display member 200 and the polarizing member 400, but not being limited thereto. Alternatively, the sensing member 300 may be located above the polarizing member 400.

The polarizing member 400 may be located on the sensing member 300. Although not illustrated in FIGS. 1 and 2, an adhesive layer may be between the polarizing member 400 and the sensing member 300. In an embodiment, an adhesive layer may be between the sensing member 300 and the display member 200. The adhesive layer may include a transparent adhesive layer. In one embodiment, for example, the adhesive layer may include an optical clear adhesive ("OCA"). However, the embodiment is not limited thereto. Alternatively, the adhesive layer may include an optically clear resin ("OCR"). In another alternative embodiment, the adhesive layer may include a pressure-sensitive adhesive ("PSA"). The PSA may include a polymer cured product. The PSA may be in a film shape including an adhesive, and performs an adhesive function in response to a pressure supplied from the outside. The PSA may include an acrylic or rubber adhesive, or an adhesive containing fine particles such as zirconium in the acrylic or rubber adhesive.

The polarizing member 400 may include an anti-reflection layer. The anti-reflection layer may reduce the reflectance of light incident from the outside (external light) toward the display member 200 through the window coupled above the polarizing member 400. The anti-reflection layer may include a retarder and a polarizer. The retarder may be a film type or a liquid crystal coating type and may include a λ/2 retarder and/or a λ/4 retarder. The polarizer may also be a film type or a liquid crystal coating type. The film-type polarizer may include a stretch-type synthetic resin film, and the liquid crystal coating-type polarizer may include liquid crystals in a predetermined arrangement. The retarder and the polarizer may further include a protective film. The protective film of the retarder and the polarizer may be defined as a base layer of the anti-reflection layer.

In an alternative embodiment, the anti-reflection layer may include a black matrix and color filters. The color filters may be arranged to correspond to the color of light to be emitted from each of the pixels of the display member 200. Each of the color filters may include red, green, or blue pigments or dyes. Alternatively, each of the color filters may further include quantum dots in addition to the pigments or dyes stated above. Alternatively, some of the color filters may not include the pigments or dyes stated above and may include scattering particles such as titanium oxide.

In another alternative embodiment, the anti-reflection layer may include a destructive interference structure. The destructive interference structure may include a first reflective layer and a second reflective layer arranged in different layers from each other. First reflected light and second reflected light respectively reflected from the first reflective layer and the second reflective layer may destructively interfere, and thus, the reflectance of external light may be reduced.

The polarizing member 400 may include a lens layer. The lens layer may improve the light output efficiency of the light emitted from the display member 200 or reduce color deviation. The lens layer may include a layer having a concave or convex lens shape and/or may include a plurality of layers having different refractive indices from each other. The polarizing member 400 may include both of the anti-reflection layer and the lens layer or may include one of the anti-reflection layer and the lens layer.

In an embodiment, the polarizing member 400 may be formed continuously after a process of forming the display member 200 and/or the sensing member 300. In such an embodiment, an adhesive layer may not be between the polarizing member 400, the display member 200, and/or the sensing member 300.

Although not illustrated in FIG. 3, the display member 200, the sensing member 300 or the polarizing member 400 may include an opening in the display area DA. In an embodiment, each of the display member 200, the sensing member 300 and the polarizing member 400 may include an opening and the openings may overlap each other. In an alternative embodiment, one or more of the display member 200, the sensing member 300, and the polarizing member 400 may not include openings. The opening may be a hole penetrating elements or a transmission area that does not have a hole. In an embodiment, the opening of each of the display member 200, the sensing member 300, and the polarizing member 400 may be a transmission area having a hole. In an alternative embodiment, the opening of each of the display member 200, the sensing member 300, and the polarizing member 400 may be a transmission area which does not have a hole. A component for various functions to be added to the display device may be located in the openings of the display member 200, the sensing member 300, and the polarizing member 400. The component may be located in the openings of the display member 200, the sensing member 300, and the polarizing member 400 or below the display member 200.

The component may include an electronic element. In an embodiment, for example, the component may include an electronic element using light or sound. In one embodiment, for example, the electronic element may include a sensor for outputting and/or receiving light, such as an infrared sensor, a camera for capturing an image by receiving light, a sensor for outputting and sensing light or sound to measure a distance or recognize a fingerprint, a small lamp for outputting light, a speaker for outputting sound, or the like. An electronic element may use light of various wavelengths such as visible light, infrared light, ultraviolet light, or the like. In an embodiment, the opening may be a transmission area through which light and/or sound output from the component to the outside or from the outside toward the electronic element may pass.

In an alternative embodiment, where the display device is a smart watch or an instrument panel for vehicles, the component may be a member such as the hand of a clock or a needle for indicating certain information (for example, speed of a vehicle or the like). In such an embodiment, where the display device includes the hand of a clock or the instrument panel for vehicles, the component may be exposed to the outside through the window and the window may include an opening.

The component may include component(s) associated with a function of the display device as described above or may include components such as accessories that increase aesthetics of the display device The driving unit 500 may be located in the second area A2. The driving unit 500 may be connected to a pad unit of the substrate 100 and may supply scan a signal and a data signal to a scan line and a data line. In one embodiment, for example, the driving unit 500 may include a driving integrated circuit chip and may be mounted above the pad unit of the substrate 100. In such an embodiment, the pad unit of the substrate 100 may be electrically connected directly to the driving integrated circuit chip.

In an alternative embodiment, a flexible printed circuit board ("FPCB") 800 may be mounted above the pad unit of the substrate 100 and the driving integrated circuit chip may be mounted above the FPCB 800. A chip on film ("COF") or a flexible printed circuit ("FPC") may be applied to the FPCB 800 and the driving integrated circuit chip for supplying a signal for causing a plurality of pixels PX of the display member 200 to emit light may be mounted above the FPCB 800.

A bending protective layer 600 may be located above the peripheral area PA of the substrate 100. The bending protective layer 600 may be located from an end of the display member 200 to a vicinity of an end of the driving unit 500 through the bending area BA. However, a formation location of the bending protective layer 600 is not limited thereto and various deformable structures capable of covering the bending area BA may be included.

The bending protective layer 600 may adjust a location of a neutral plane at which a strain becomes substantially zero at the time of bending such that a deformation force applied to the substrate 100 may be compressive stress instead of tensile stress. Accordingly, the bending protective layer 600 may cover the bending area BA of the substrate 100 to minimize damage of the bending area BA of the substrate 100.

An elastic modulus of the bending protective layer 600 may be about 500 megapascals (MPa) to about 100 gigapascals (GPa). However, the bending protective layer 600 is not limited thereto and the elastic modulus of the bending protective layer 600 may be variously modified according to a design condition such as a thickness of the substrate 100 or the like.

In an embodiment, the bending protective layer 600 may include an acrylic or silicon-based resin and fine particles may be included in the resin. The fine particles may include polymer-based nanoparticles or microparticles, or the like, the polymer-based nanoparticles and microparticles including rubber, epoxy, epoxy hybrid including silica. In an embodiment, the bending protective layer 600 may include various film-types including PET or the like.

Although FIG. 2 illustrates an embodiment where ends of the display member 200, the sensing member 300, and the polarizing member 400 are aligned with each other, embodiments of the invention are not limited thereto. In an embodiment, as stated above, the display member 200 may include a light-emitting element, a thin-film transistor, and an encapsulation layer covering the light-emitting element and the thin-film transistor. In such an embodiment, an end of the encapsulation layer may extend further from the sensing member 300 and the polarizing member 400. In an embodiment, the polarizing member 400 may be located to be in contact with the bending protective layer 600 and may located adjacent to the bending protective layer 600. The polarizing member 400 may extend to the bending area BA and function as a bending protective layer.

In an embodiment, the substrate 100 may have one surface and another surface located on the opposite side of the one surface, and the display member 200 may be located on the one side of the substrate 100. A protective film 700 may be located in the other surface of the substrate 100 opposite to the one surface of the substrate 100 where the display member 200 is located.

The protective film 700 may be attached to the other surface of the substrate 100 to protect the display device. Although not illustrated in FIG. 2, the protective film 700 may be attached to the other surface of the substrate 100 through an adhesive layer. The protective film 700 may include a first protective film 701 and a second protective film 703 which are spaced apart from each other. The first protective film 701 may be attached to a location corresponding to the first area A1 of the substrate 100. The second protective film 703 may be attached to a location corresponding to the second area A2 of the substrate 100. In such an embodiment, the protective film 700 may not be attached to a location corresponding to the bending area BA. Accordingly, a stress applied to the substrate 100 and the protective film 700 during bending of the substrate 100 may be minimized to prevent damage to the substrate 100 in the bending area BA during bending. Although the protective film 700 is not attached to the bending area BA of the substrate 100, the disclosure is not limited thereto. In one alternative embodiment, for example, the protective film 700 may be located on the another surface of the substrate 100, that is, an entire surface of the substrate 100, and may be located in the first area A1, the second area A2, and the bending area BA. Alternatively, a groove may be defined or formed in the protective film 700 in a location corresponding to the bending area BA of the substrate 100.

Figure 4:
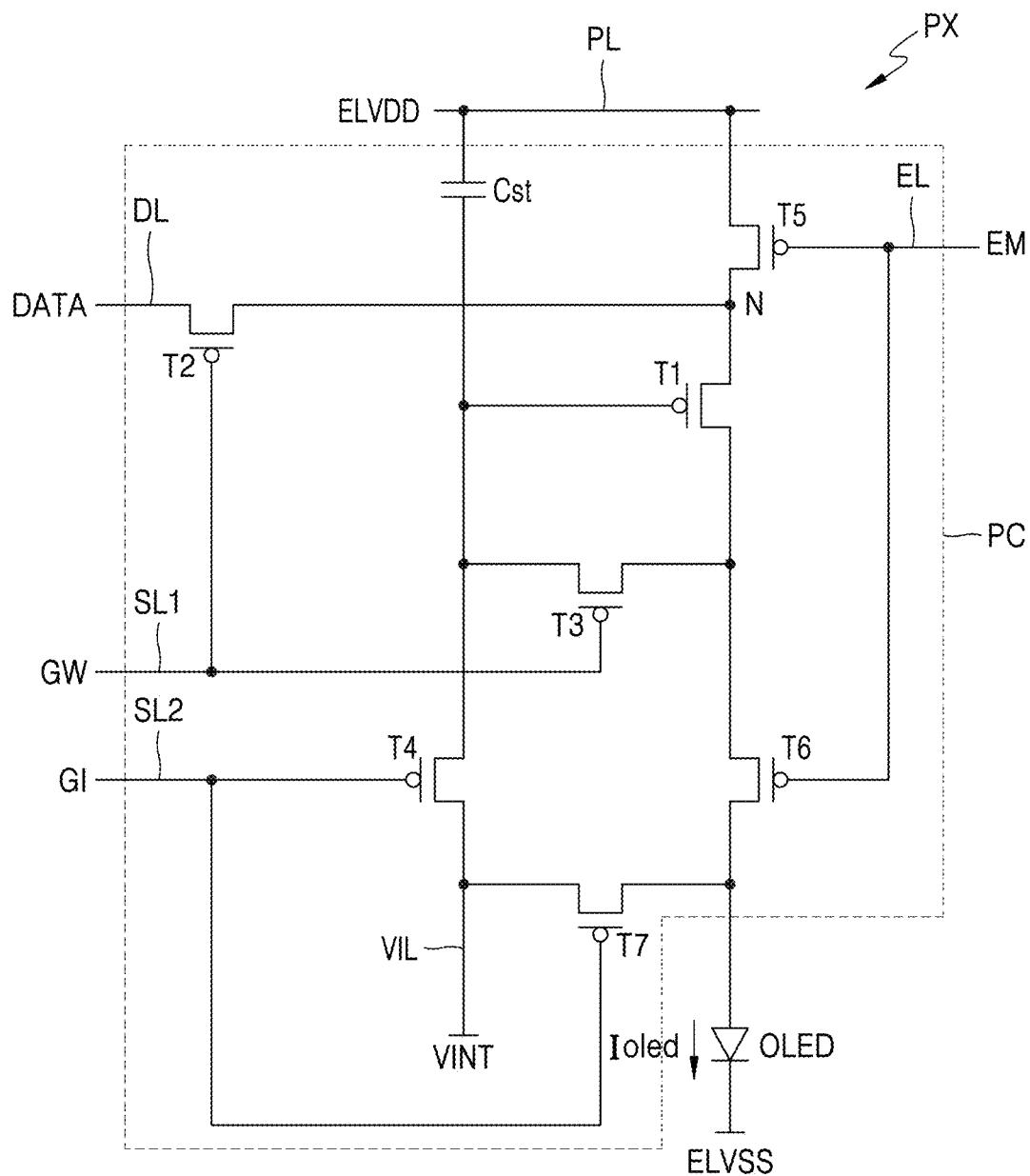
FIG. 4 is an equivalent circuit diagram of a pixel according to an embodiment.

FIG. 4 is an equivalent circuit diagram of a pixel PX according to an embodiment.

Referring to FIG. 4, in an embodiment, each pixel PX may include signal lines SL1, SL2, EL, and DL, an initialization voltage line VIL, and a power voltage line PL. In an alternative embodiment, at least one of the signal lines SL1, SL2, EL, and DL, the initialization voltage line VIL, and/or the power supply voltage line PL may be shared in or commonly connected to neighboring pixels PX.

The signal lines include a first scan line SL1 for transmitting a first scan signal GW, a second scan line SL2 for transmitting a second scan signal GI, a light-emission control line EL for transmitting a light-emission control signal EM, and a data line DL intersecting the first scan line SL1 and for transmitting a data signal DATA. The second scan line SL2 may be connected to the first scan line SL1 of a next row or a previous row and the second scan signal GI may be the first scan signal GW of the next row or the previous row.

The power supply voltage line PL may transmit a first power supply voltage ELVDD to a first transistor T1 and the initialization voltage line VIL may transmit an initialization voltage VINT for initializing the first transistor T1 and a pixel electrode to the pixel PX.

The first scan line SL1, the second scan line SL2, the light emission control line EL, and the initialization voltage line VIL may extend in the first direction D1 and may be apart from one another in each row. The data line DL and the power supply voltage line PL may extend in the second direction D2 and may be apart from one another in each column.

A pixel circuit PC of the pixel PX may include a plurality of transistors, e.g., first to seventh transistors T1 to T7, and a capacitor Cst. The first to seventh transistors T1 to T7 may include thin-film transistors.

The first transistor T1 is connected to the power supply voltage line PL via the fifth transistor T5 and is electrically connected to a pixel electrode of an organic light-emitting diode OLED via the sixth transistor T6. The first transistor T1 functions as a driving transistor and receives the data signal DATA according to a switching operation of the second transistor T2 to supply a driving current Ioled to the organic light-emitting diode OLED.

The second transistor is connected to the first scan line SL1 and the data line DL and is turned on in response to the first scan signal GW received through the first scan line SL1 to perform the switching operation for transmitting the data signal DATA transmitted by the data line DL to a node N.

The third transistor T3 is connected to the pixel electrode of the organic light-emitting diode OLED via the sixth transistor T6. The third transistor T3 is turned on in response to the first scan signal GW received through the first scan line SL1 to diode-connect the first transistor T1.

The fourth transistor T4 is turned on in response to the second scan signal GI received through the second scan line SL2 and transmits the initialization voltage VINT from the initialization voltage line VIL to a gate electrode of the first transistor T1 to initialize a gate voltage of the first transistor T1.

The fifth transistor T5 and the sixth transistor T6 are simultaneously turned on in response to the light emission control signal EM received through the light emission control line EL and forms a current path such that the driving current Ioled may flow from the power supply voltage line PL to a direction of the organic light-emitting diode OLED.

The seventh transistor T7 is turned on in response to the second scan signal GI received through the second scan line SL2 and transmits the initialization voltage VINT from the initialization voltage line VIL to the pixel electrode of the organic light-emitting diode OLED to initialize the pixel electrode of the organic light-emitting diode OLED. Alternatively, the seventh transistor T7 may be omitted.

Although FIG. 4 illustrates an embodiment where the fourth transistor T4 and the seventh transistor T7 are connected to the second scan line SL2, embodiments of the invention are not limited thereto. In an alternative embodiment, the fourth transistor may be connected to the second scan line SL2 and the seventh transistor T7 may be connected to a separate wire and may be driven in response to a signal transmitted to the wire.

The capacitor Cst may maintain a voltage applied to the gate electrode of the first transistor T1 by being connected to the power supply voltage line PL and the gate electrode of the first transistor T1 and storing and maintaining a voltage corresponding to a difference between voltages of two ends of the power supply voltage line PL and the gate electrode of the first transistor T1.

The organic light-emitting diode OLED may include the pixel electrode, a common electrode facing the pixel electrode, and an emission layer between the pixel electrode and the common electrode. The common electrode may receive a second power supply voltage ELVSS. The organic light-emitting diode OLED may display an image by receiving the driving current Ioled from the first transistor T1 and emitting light.

Figure 5A:
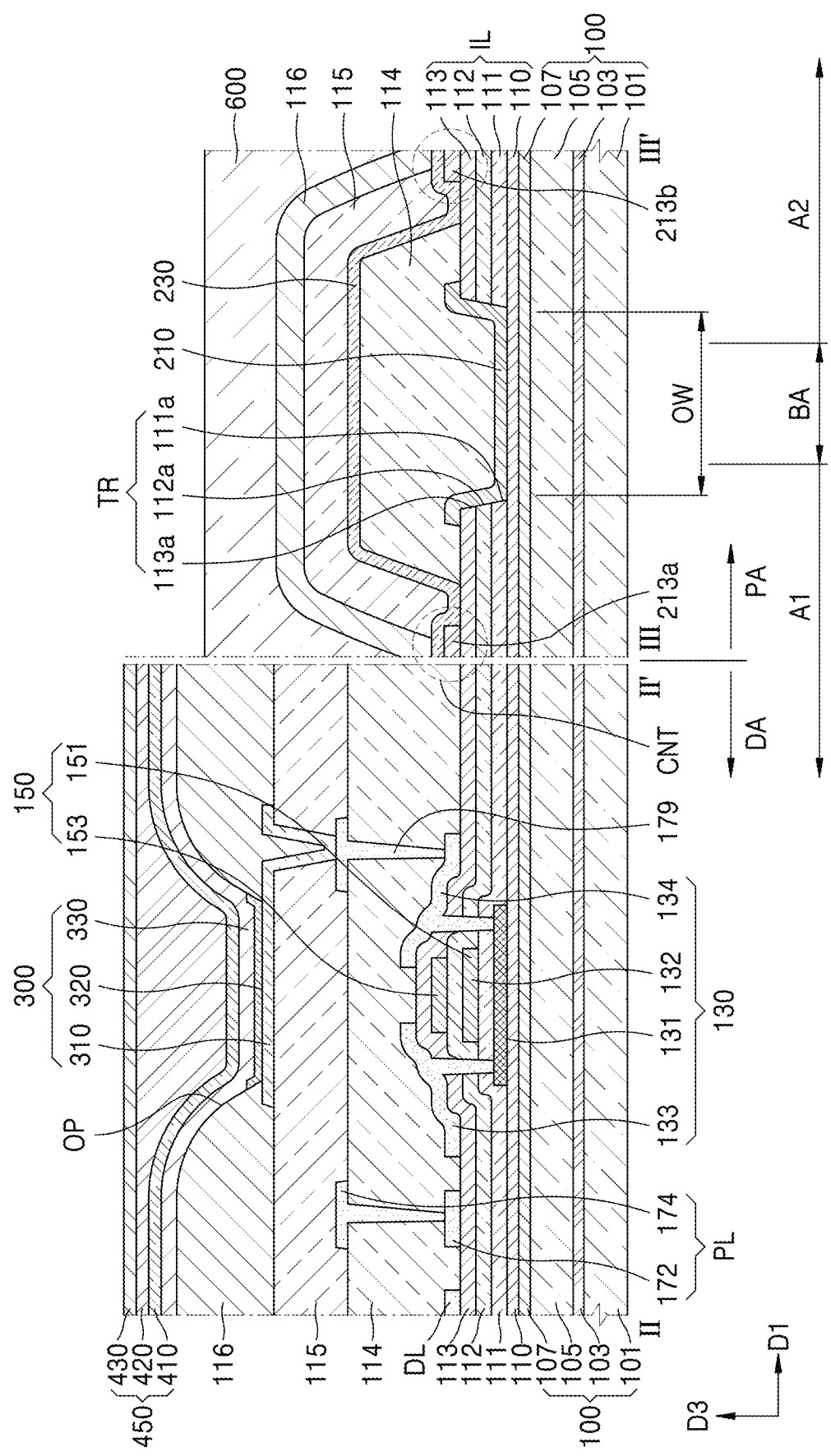
FIGS. 5A to 5C are schematic cross-sectional views of a portion of the display device in FIG. 1 according to an embodiment.
Figure 5B:
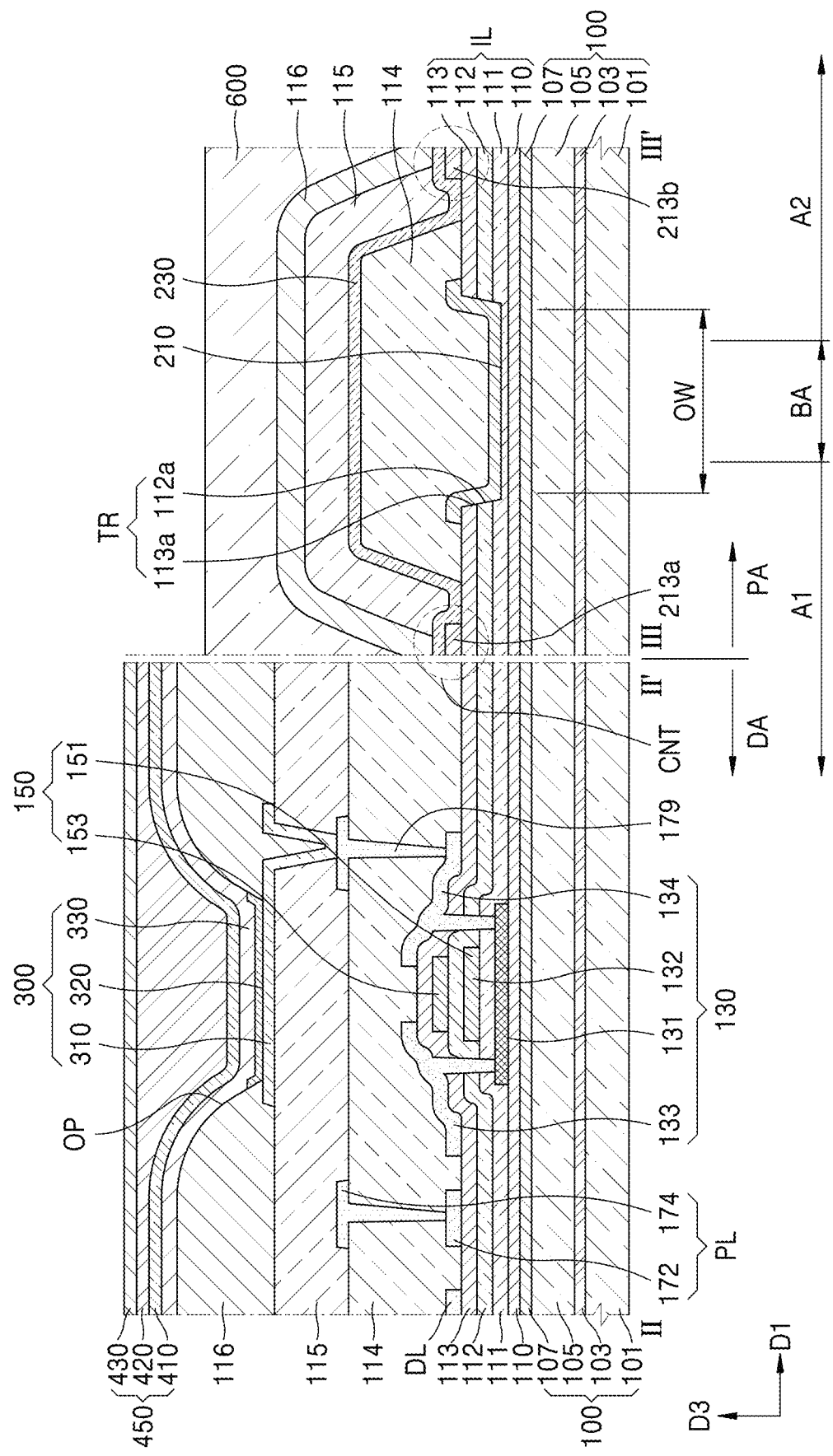
Figure 5C:
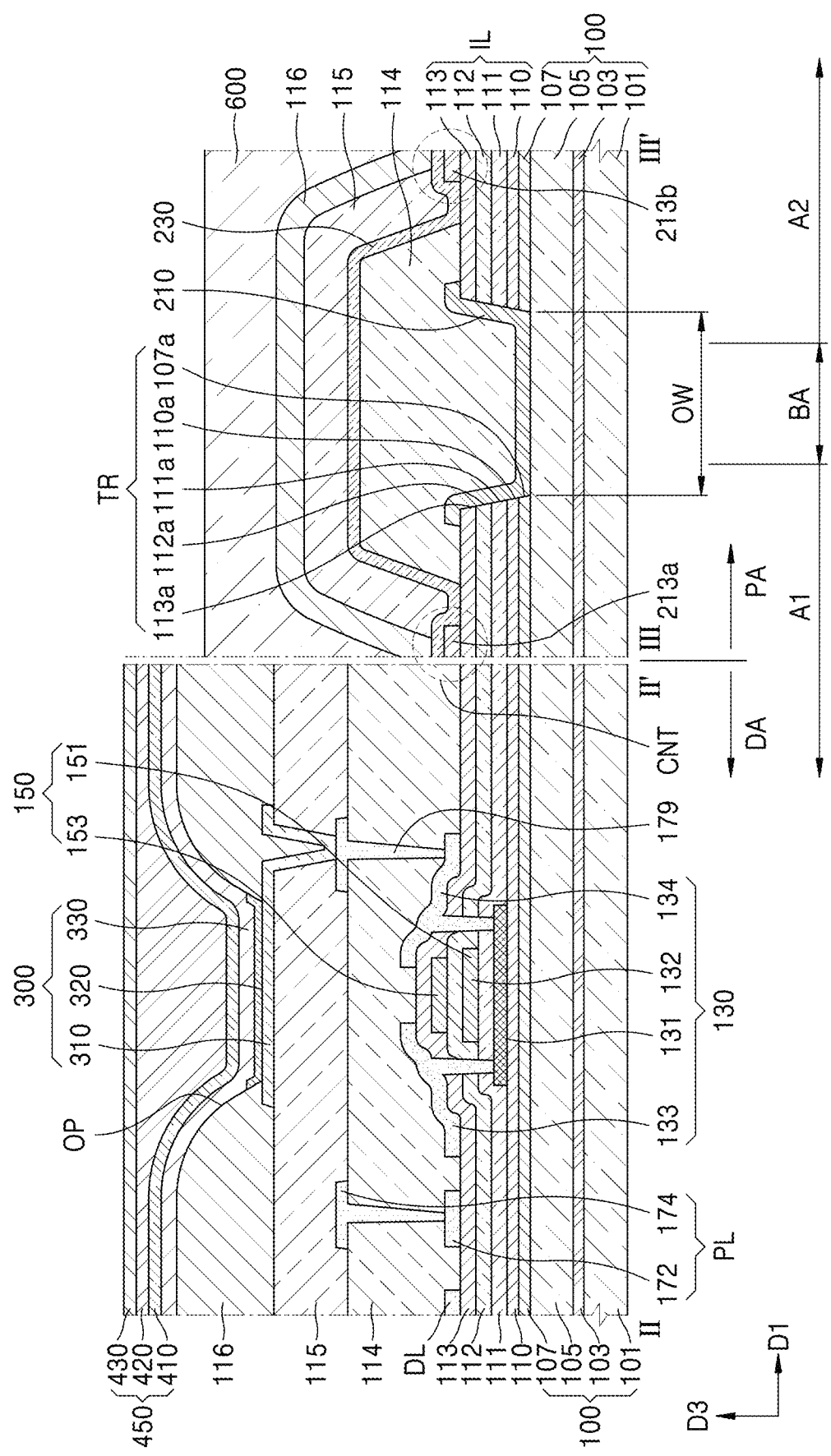

FIGS. 5A to 5C are schematic cross-sectional views of a portion of the display device in FIG. 1 according to an embodiment. FIGS. 5A to 5C are cross-sectional views taken along lines II-II' and III-III' in FIG. 3.

Referring to FIG. 5A, in an embodiment, a display element DE, and a thin-film transistor 130 and a capacitor 150, which are electrically connected to the display element DE, may be located in the display area DA of the substrate 100. In such an embodiment, a first electrode 310 of the display element DE may be electrically connected to the thin-film transistor 130. In an embodiment, as shown in FIG. 4, the display element DE may be the organic light-emitting diode OLED. In such an embodiment, the thin-film transistor 130 and the capacitor 150 may be one of the first to seventh transistors T1 to T7 and the capacitor Cst included in the pixel circuit PC.

The substrate 100 may include a glass material or a polymer resin. The substrate 100 may have a multilayer structure. In one embodiment, for example, the substrate 100 may include a first base layer 101, a first barrier layer 103, a second base layer 105, and a second barrier layer 107.

In such an embodiment, each of the first base layer 101 and the second base layer 105 may include a polymer resin. In one embodiment, For example, the first base layer 101 and the second base layer 105 may include a polymer resin such as PES, PAR, PEI, PEN, PET, PPS, PI, PC, cellulose triacetate ("TAC"), CAP, or the like. Each of the first base layer 101 and the second base layer 105 may include a transparent polymer resin.

The first barrier layer 103 and the second barrier layer 107 are barrier layers for preventing penetration of external foreign substances. The first barrier layer 103 and the second barrier layer 107 may have a single layer structure or a multilayer structure including an inorganic material such as silicon nitride or silicon oxide.

A buffer layer 110 may be disposed on or located above the substrate 100. The buffer layer 110 may include an inorganic insulating material such as silicon nitride or silicon oxide and may have a single layer structure or a multilayer structure.

The thin-film transistor 130 may include a semiconductor layer 131, a gate electrode 132, a source electrode 133, and a drain electrode 134. The semiconductor layer 131 may include amorphous silicon, polycrystalline silicon, or an organic semiconductor material. In an embodiment, a material of the gate electrode 132 may be determined based on the adhesion with adjacent layers, surface smoothness, and machinability of layers to be stacked. In one embodiment, for example, the gate electrode 132 may include, for example, at least one material selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may have a single layer structure or a multilayer structure.

In an embodiment, a first insulating layer 111 including an inorganic material such as silicon oxide, silicon nitride, and/or silicon oxynitride, or the like may be between the semiconductor layer 131 and the gate electrode 132 to secure insulation between the semiconductor layer 131 and the gate electrode 132. A second insulating layer 112 and a third insulating layer 113 both including an inorganic material such as silicon oxide, silicon nitride, and/or silicon oxynitride, or the like may be between the gate electrode 132, the source electrode 133, and the drain electrode 134. Each of the source electrode 133 and the drain electrode 134 may be electrically connected to the semiconductor layer 131 through contact holes defined or formed in the first insulating layer 111, the second insulating layer 112, and the third insulating layer 113.

In an embodiment, the source electrode 133 and the drain electrode 134 may include, for example, at least one material selected from Al, Pt, Pd, Ag, Mg, Au, Ni, Nd, Ir, Cr, Li, Ca, Mo, Ti, W and Cu based on predetermined conductivity thereof, and may have a single layer structure or a multilayer structure.

The capacitor 150 includes a lower electrode 151 and an upper electrode 153 which overlap each other with a second insulating layer 112 between the lower electrode 151 and the upper electrode 153. The capacitor 150 may overlap the thin-film transistor 130. In an embodiment, as shown in FIG. 5A, the gate electrode 132 of the thin-film transistor 130 is the lower electrode 151 of the capacitor 150. In an alternative embodiment, the capacitor 150 may not overlap the thin-film transistor 130. The capacitor 150 may be covered by the third insulating layer 113.

The pixel circuit including the thin-film transistor 130 and the capacitor 150 may be covered by a fourth insulating layer 114 and a fifth insulating layer 115. The fourth insulating layer 114 and the fifth insulating layer 115 may be a planarization insulating layer and an organic insulating layer. The fourth insulating layer 114 and the fifth insulating layer 115 may include a commercially available polymer such as poly(methyl methacrylate) ("PMMA") or polystyrene ("PS"), a polymer derivative having a phenol group, and an organic insulating material such as an acrylic polymer, an imide polymer, an aryl ether polymer, an amide polymer, a fluorine polymer, a p-xylene polymer, a vinyl alcohol polymer, and a blend thereof. In an embodiment, the fourth insulating layer 114 and the fifth insulating layer 115 may include PI.

In an embodiment, the data line DL may be located between the third insulating layer 113 and the fourth insulating layer 114. The power supply voltage line PL may include a first power supply voltage line 172 located in a same layer as the data line DL and a second power supply voltage line 174 between the fourth insulating layer 114 and the fifth insulating layer 115. The second power supply voltage line 174 may overlap the first power supply voltage line 172 and may be electrically connected to the first power supply voltage line 172 through a contact hole defined or formed in the fourth insulating layer 114. The data line DL and the first power supply voltage line 172 may include Mo, Al, Cu, Ti, or the like, and may have a single layer structure or a multilayer structure. In an embodiment, the data line DL and the first power supply voltage line 172 may include a multilayer structure of Ti/Al/Ti. The second power supply voltage line 174 may include Mo, Al, Cu, Ti, or the like, and may have a single layer structure or a multilayer structure. In an embodiment, the second power supply voltage line 174 may include a multilayer structure of Ti/Al/Ti.

In an embodiment, as shown in FIG. 5A, the power supply voltage line PL has a double layer structure of the first power supply voltage line 172 and the second power supply voltage line 174, but embodiments are not limited thereto. In an alternative embodiment, the power supply voltage line PL may have a single layer structure located in a same layer as the data line DL or have a single layer structure between the fourth insulating layer 114 and the fifth insulating layer 115 similarly to the second power supply voltage line 174.

The display element DE may be located above the fifth insulating layer 115. The display element DE may include the first electrode 310 which is the pixel electrode, an intermediate layer 320, and a second electrode 330 which is an opposite electrode.

The first electrode 310 of the display element DE may be located on the fifth insulating layer 115 and connected to the thin-film transistor 130 through a connection electrode 179 on the fourth insulating layer 114.

In an embodiment, the first electrode 310 may include a conductive oxide such as an indium tin oxide ("ITO"), an indium zinc oxide ("IZO"), a zinc oxide (ZnO), an indium oxide ($In_2O_3$), an indium gallium oxide ("IGO"), or an aluminum zinc oxide ("AZO"). In an alternative embodiment, the first electrode 310 may include a reflective film, and the reflective film may include Ag, Mg, Al, Pt, Pd, Au, Ni, Nd, Ir, Cr, or a combination (e.g., a compound) thereof. In another alternative embodiment, the first electrode 310 may further include a film including ITO, IZO, ZnO, or $In_2O_3$ above/below the reflective film mentioned above.

A sixth insulating layer 116 may be located on the fifth insulating layer 115. The sixth insulating layer 116 may function as a pixel defining layer defining the pixel by having an opening corresponding to each pixel, that is, an opening OP exposing a portion the first electrode 310. In an embodiment, the sixth insulating layer 116 may increase a distance between an edge of the first electrode 310 and the second electrode 330 above the first electrode 310 to prevent an arc or the like from being formed at the edge of the first electrode 310. The sixth insulating layer 116 may include an organic material such as PI or hexamethyldisiloxane ("HMDDSO").

The intermediate layer 320 includes an emission layer. The emission layer may include a polymer or low-molecular-weight organic material which emits light of a certain color. In an embodiment, the intermediate layer 320 may include a first functional layer below the emission layer and/or a second functional layer above the emission layer. The first functional layer and/or the second functional layer may include an integrated (or common) layer over a plurality of first electrodes 310 or may include a patterned layer corresponding to each of the plurality of first electrode 310.

The first functional layer may have a single layer structure or a multilayer structure. In one embodiment, for example, when the first functional layer includes a polymer material, the first functional layer may include a hole transport layer ("HTL") having a single-layered structure and may include poly-(3,4)-ethylene-dihydroxy thiophene ("PEDOT") or polyaniline ("PANI"). In an embodiment, where the first functional layer includes a low-molecular-weight material, the first functional layer may include a hole injection layer ("HIL") and an HTL.

Alternatively, the second functional layer may be omitted. In one embodiment, for example, where the first functional layer and the emission layer include a polymer material, the second functional layer is preferably formed to improve the characteristics of the organic light-emitting diode OLED. The second functional layer may have a single layer structure or a multilayer structure. The second functional layer may include an electron transport layer ("ETL") and/or an electron injection layer ("EIL").

The second electrode 330 may be located to face the first electrode 310 with the intermediate layer 320 between the second electrode 330 and the first electrode 310. The second electrode 330 may include a conductive material having a low work function. In one embodiment, for example, the second electrode 330 may include a (semi)transparent layer, and the (semi)transparent layer may include Mg, Al, Pt, Pd, Au, Ni, Nd, Ir, Cr, Li, Ca, a combination (e.g., an alloy) thereof, or the like. Alternatively, the second electrode 330 may further include a layer such as ITO, IZO, ZnO, or $In_2O_3$ above the (semi)transparent layer including the above-stated material. The second electrode 330 may be located on the intermediate layer 320 and the sixth insulating layer 116. The second electrode 330 may be integrally formed as a single unitary unit with respect to a plurality of display elements DE in the display area DA to face the plurality of first electrodes 310.

An encapsulation layer 450 may be located above the second electrode 330 such that the display device may be protected from foreign substances, moisture, or the like from the outside. The encapsulation layer 450 may cover the display area DA and extend to the outside of the display area DA. The encapsulation layer 450 may include an organic encapsulation layer and an inorganic encapsulation layer. In an embodiment, as shown in FIG. 5A, the encapsulation layer 450 includes first and second inorganic encapsulation layers 410 and 430, and an organic encapsulation layer 420 between the first and second inorganic encapsulation layers 410 and 430. In an alternative embodiment, the number of the organic encapsulation layer, the number of the inorganic encapsulation layer, and the order of lamination thereof may be variously modified.

The first and second inorganic encapsulation layers 410 and 430 may each include one or more inorganic materials such as aluminum oxide, titanium oxide, tantalum oxide, hafnium oxide, zinc oxide, silicon oxide, silicon nitride, silicon oxynitride, and may be formed by chemical vapor deposition. The organic encapsulation layer 420 may include PET, PEN, PC, PI, polyethylene sulfonate, polyoxymethylene ("POM"), PAR, HMDSO, an acrylic-based resin (for example, PMMA and poly(acrylic acid), or a combination thereof. Although not illustrated in FIG. 5A, other layers such as a capping layer may be between the first inorganic encapsulation layer 410 and the second electrode 330 as desired. Since the first inorganic encapsulation layer 410 is formed along an underlying structure, an upper surface of the first inorganic encapsulation layer 410 may not be flat. Unlike the first inorganic encapsulation layer 410, an upper surface of the organic encapsulation layer 420 may be formed substantially flat. The second inorganic encapsulation layer 430 may be in contact with the first inorganic encapsulation layer 410 in the peripheral area PA to prevent the organic encapsulation layer 420 from being exposed to the outside.

Although not illustrated in FIG. 5A, a polarizing plate may be adhered above the encapsulation layer 450 through a light-transmissive adhesive. The polarizing plate may have a structure that reduces external light reflection and a layer including a black matrix and a color filter may be used instead of the polarizing plate.

The buffer layer 110, the first insulating layer 111, the second insulating layer 112, and the third insulating layer 113 may be collectively referred to as an inorganic insulating layer IL, and the buffer layer 110, the first insulating layer 111, the second insulating layer 112 and the third insulating layer 113 include an inorganic material. FIG. 5A illustrates an embodiment where the inorganic insulating layer IL in the peripheral area PA including the bending area BA includes the buffer layer 110, the first insulating layer 111, the second insulating layer 112, and the third insulating layer 113. In an alternative embodiment, the inorganic insulating layer IL may include at least one of the buffer layer 110, the first insulating layer 111, the second insulating layer 112, and the third insulating layer 113.

In an embodiment, as shown in FIG. 5A, the inorganic insulating layer IL may have a trench TR corresponding to the bending area BA. The trench TR may pass through the first insulating layer 111, the second insulating layer 112, and the third insulating layer 113, and a bottom surface of the trench TR may be an upper surface of the buffer layer 110. The trench TR may be defined by an opening 111a of the first insulating layer 111, and opening 112a of the second insulating layer 112, and an opening of the third insulating layer 113, the first insulating layer 111, the second insulating layer 112, and the third insulating layer 113 corresponding to the bending area BA. FIG. 5A illustrates an embodiment where inner side surfaces of the opening 111a of the first insulating layer 111, the opening of the second insulating layer 112, and the opening 113a of the third insulating layer 113 coincide with each other. In an alternative embodiment, the inner side surfaces of the openings 111a, 112a, and 113a may not coincide with each other and sizes of the openings 111a, 112a, and 113a may be different from each other.

The trench TR corresponding to the bending area BA may be defined in a way such that the trench TR overlaps the bending area BA. An area of the trench TR may be greater than an area of the bending area BA. In an embodiment, as shown in FIG. 5A, a width OW of the trench TR is greater than a width of the bending area BA. Herein, the area of the trench TR may be an area of a bottom surface of the trench TR, which has a minimum area when the trench TR is viewed from above. In an embodiment, as shown in FIG. 5A, the area of the trench TR is defined by an opening area of the first insulating layer 111 among the openings 111a, 112a, and 113a of the first insulating layer 111, the second insulating layer 112, and the third insulating layer 113.

An embodiment of the display device may have a first conductive layer 230 extending in the first direction D1. The first conductive layer 230 extends from the first area A1 to the second area A2 through the bending area BA and is located on the fourth insulating layer 114 which is an organic insulating layer. In an embodiment, where the fourth insulating layer 114 is omitted, the first conductive layer 230 may be located on the inorganic insulating layer IL such as the third insulating layer 113 or the like. The first conductive layer 230 may be simultaneously formed during a process of forming the second power supply voltage line 174 using a same material as that of the second power supply voltage line 174. In one embodiment, for example, the first conductive layer 230 may include Mo, Al, Cu, Ti, or the like, and may have a single layer structure or a multilayer structure. In an embodiment, the first conductive layer 230 may include a multilayer structure of Ti/Al/Ti.

In a process of bending the substrate 100 or the like, a tensile stress may be applied to inorganic material layers located in the bending area BA. Since the inorganic material layer typically has a greater hardness than an organic material layer, cracks are likely to occur in the inorganic material layer by the bending of the substrate 100 or the like. Cracks or the like may also occur in the first conductive layer 230 on the inorganic material layer due to cracks in the inorganic material layer, which may cause a defect, such as disconnection, in the display device. According to an embodiment, as the first insulating layer 111, the second insulating layer 112, and the third insulating layer 113 of the inorganic insulating layer IL, which is an inorganic material layer, include the trench TR, cracks or the like due to stress may be effectively prevented or the possibility of occurrence of cracks or the like may be reduced. In such an embodiment, the width OW of the trench TR may be equal to or greater than the width of the bending area BA, thereby reducing defects caused by cracks.

To minimize the possibility of occurrence of cracks, after the trench TR is formed in the first insulating layer 111, the second insulating layer 112 and the third insulating layer 113 in the bending area BA, the trench TR may be extended to the buffer layer 110 and the second barrier layer 107 which are inorganic material layers by an additional etching process. However, the manufacturing cost may be increased by using an additional mask process for additional etching.

According to an embodiment, a construction member 210 may be simultaneously formed in the bending area BA when a conductive layer of the display area DA is formed without using an additional etching process for removing an inorganic material layer below the first insulating layer 111 in the bending area BA such as the buffer layer 110 and the second barrier layer 107. The construction member 210 may function as a crack blocking layer that prevents cracks from spreading from an inorganic material layer remaining in the bending area BA, that is the second barrier layer 107 and/or the buffer layer 110 (or a portion of the buffer layer 110) to the first conductive layer 230 and reduce tensile stress. Accordingly, defects that may occur in the first conductive layer 230 in the bending process may be effectively prevented or substantially minimized without using an additional etching process.

In an embodiment, the construction member 210 may be provided in the trench TR of the bending area BA. In such an embodiment, the construction member 210 may be provided in the trench TR of the inorganic insulating layer IL. In such an embodiment, the construction member 210 may be provided in the trench TR formed by removing a portion of the first insulating layer 111, the second insulating layer 112, and the third insulating layer 113 of the inorganic insulating layer IL in correspondence with the bending area BA. The construction member 210 may be in contact with the upper surface of the buffer layer 110 of the bending area BA.

A second conductive layer 213a and a third conductive layer 213b may be located directly on the inorganic insulating layer IL, for example, the third insulating layer 113. The second conductive layer 213a and the third conductive layer 213b are separated from each other with the trench TR of the inorganic insulating layer IL between the second conductive layer 213a and the third conductive layer 213b. The second conductive layer 213a may be located in the first area A1 and the third conductive layer 213b may be located in the second area A2. The second conductive layer 213a and the third conductive layer 213b may be in contact with and electrically connected to the first conductive layer 230 in a contact portion CNT. The second conductive layer 213a and the third conductive layer 213b may be located in a same layer as the data line DL and the first power supply voltage line 172 and include a same material as the data line DL and the first power supply voltage line 172. In one embodiment, for example, the second conductive layer 213a and the third conductive layer 213b may include Mo, Al, Cu, Ti, or the like and may have a single layer structure or a multilayer structure. In an embodiment, the second conductive layer 213a and the third conductive layer 213b may include a multilayer structure of Ti/Al/Ti.

The second conductive layer 213a located in the first area A1 may be electrically connected to the pixel PX in the display area DA. Accordingly, the first conductive layer 230 and the third conductive layer 213b may be electrically connected to the pixel PX in the display area DA through the second conductive layer 213a. The second conductive layer 213a may be electrically connected to a element located in the display area DA while located in the peripheral area PA and may be located in the peripheral area PA and extend to the display area DA such that at least a portion of the second conductive layer 213a may be located in the display area DA. In an embodiment, where the third conductive layer 213b is located in the second area A2, at least a portion of an upper portion of the third conductive layer 213b may be exposed to the outside to be electrically connected to various types of electronic elements, a printed circuit board, or the like.

The construction member 210 may include a same material as the data line DL and the first power supply voltage line 172. In one embodiment, for example, the construction member 210 may include Mo, Al, Cu, Ti, or the like, and may have a single layer structure or a multilayer structure. In an embodiment, the construction member 210 may include a multilayer structure of Ti/Al/Ti.

The construction member 210 may cover a bottom surface of the trench TR of the inorganic insulating layer IL, that is, an upper surface of the buffer layer 110 exposed by the trench TR, and an inner side surface of the trench TR. The construction member 210 may be located to further cover an upper surface of the inorganic insulating layer IL around the trench TR, that is, an upper surface of the third insulating layer 113. The construction member 210 may be completely covered by the fourth insulating layer 114 of the peripheral area PA. Accordingly, the construction member 210 may be insulated from the first conductive layer 230, the second conductive layer 213a, and the third conductive layer 213b.

A portion of the fourth insulating layer 114 may fill at least a portion of the trench TR of the inorganic insulating layer IL. The portion of the fourth insulating layer 114 may be located in the trench TR of the inorganic insulating layer IL. The first conductive layer 230 may be located on the fourth insulating layer 114 of the peripheral area PA. The fifth insulating layer 115 and the sixth insulating layer 116 may be located above the first conductive layer 230. Opposing ends of the first conductive layer 230 may be exposed without being covered by the fifth insulating layer 115 and the sixth insulating layer 116. The bending protective layer 600 may be located on the sixth insulating layer 116 of the peripheral area PA. By adjusting a thickness, modulus, or the like of the bending protective layer 600 when locating the bending protective layer 600 above the first conductive layer 230, a location of a stress neutral plane with respect to a laminate including all of the substrate 100, the construction member 210, the first conductive layer 230, and the bending protective layer 600 may be adjusted to minimize tensile stress.

FIG. 5A illustrates an embodiment where the buffer layer 110 of the inorganic insulating layer IL is not removed from the bending area BA and the trench TR passing through the first insulating layer 111, the second insulating layer 112, and the third insulating layer 113 is formed. Embodiments of the invention are not limited thereto and the trench TR may be formed to pass or defined through at least one of the buffer layer 110, the first insulating layer 111, the second insulating layer 112, and the third insulating layer 113 of the inorganic insulating layer IL in the bending area BA. In an alternative embodiment, the trench TR defined through the first insulating layer 111, the second insulating layer 112 and the third insulating layer 113 in the bending area BA and by a partially removed portion of the buffer layer 110 in the bending area BA may be formed. In such an embodiment, the trench TR may include the opening 111a of the first insulating layer 111, the opening 112a of the second insulating layer 112, and the opening 113a of the third insulating layer 113, and the bottom surface of the trench TR may be the upper surface of the partially removed portion of the buffer layer 110 partially removed. In another alternative embodiment, as shown in FIG. 5B, the trench TR defined through the second insulating layer 112 and the third insulating layer 113 in the bending area BA and by a partially removed portion of the first insulating layer 111 in the bending area BA may be formed. In such an embodiment, the buffer layer 110 and a portion of the first insulating layer 111 of the inorganic insulating layer IL may remain. The trench TR may include the opening 112a of the second insulating layer 112 and the opening 113a of the third insulating layer 113 and the bottom surface of the trench TR may be an upper surface of the partially removed portion of the first insulating layer 111. In another alternative embodiment, the trench TR defined through the buffer layer 110, the first insulating layer 111, the second insulating layer 112, and the third insulating layer 113 in the bending area BA may be formed. In such an embodiment, the trench TR may include an opening 110a of the buffer layer 110, the opening 111a of the first insulating layer 111, the opening 112a of the second insulating layer 112, and the opening 113a of the third insulating layer 113. In another alternative embodiment, as shown in FIG. 5C, the trench TR may also include an opening 107a of the second barrier layer 107 in accordance with the bending area BA. The opening 107a of the second barrier layer 107 may correspond to the openings 110a, 111a, 112a, and 113a of the inorganic insulating layer IL. In such an embodiment, the bottom surface of the trench TR may be an upper surface of the second base layer 105. In the present disclosure, the term "corresponding" may mean "overlapping".

Figure 6:
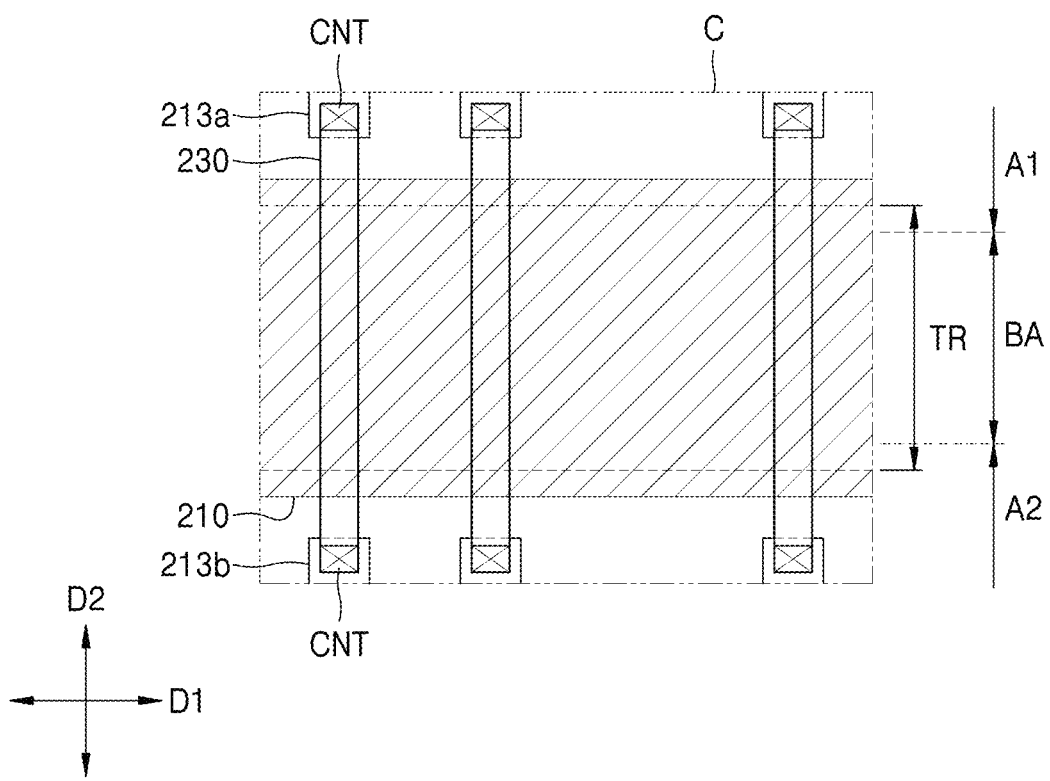
FIG. 6 is an enlarged view of an area C in FIG. 3.
Figure 7:
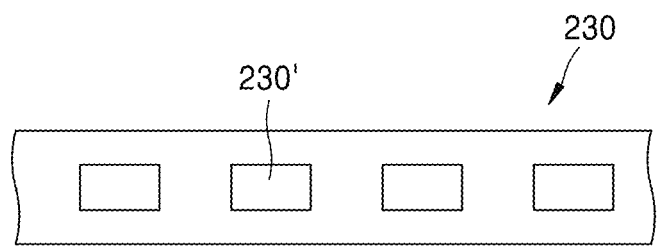
FIG. 7 is a schematic plan view of a portion of a first conductive layer according to an embodiment.

FIG. 6 is an enlarged view of an area C in FIG. 3. FIG. 7 is a schematic plan view of a portion of the first conductive layer 230 according to an embodiment. In FIG. 6, an outline of the bottom surface of the trench TR is indicated by a dotted line.

As shown in FIG. 6, the construction member 210 may have a substantially rectangular board shape which is a single unitary body in the bending area BA. The construction member 210 may be a board-shaped member corresponding to the bending area BA. The construction member 210 may be insulated from the first conductive layer 230, the second conductive layer 213a, and the third conductive layer 213b, and may be in a floating state. The construction member 210 may extend along the bending area BA in the first direction D1 and overlap the trench TR. In an embodiment, as shown in FIGS. 5A to 5C, the construction member 210 may be covered by the fourth insulating layer 114 and a plurality of first conductive layers 230 may be located on the fourth insulating layer 114. The plurality of first conductive layers 230 may extend in the second direction D2, be electrically connected to the second conductive layer 213a in the contact portion CNT in the first area A1, and be electrically connected to the third conductive layer 213b in the contact portion CNT in the second area A2. The plurality of first conductive layers 230 may overlap the construction member 210. A line width may increase as a distance between the first conductive layer 230 and the second conductive layer 213a decreases.

In an embodiment, as shown in FIG. 7, a plurality of through-holes 230' is defined or formed through the first conductive layer 230. The plurality of through-holes 230' may be arranged in a row in the second direction D2 which is an extension direction of the first conductive layer 230. Although FIG. 7 illustrates an embodiment where the through-hole 230' has a substantially rectangular shape in a plan view, embodiments of the invention are not limited thereto. In one embodiment, for example, the shape of the through-hole 230' may be variously modified to have another shape such as having a circular shape, a diamond shape, a chamfered rectangular shape, a chamfered diamond shape, an ellipse shape, a crushed circular shape, or the like in a plan view. In an embodiment, the display device may further have a protective film covering at least a portion of inner side surfaces of the plurality of through-holes 230'. The protective film may prevent or minimize an occurrence of corrosion on the inner side surfaces of the plurality of through-holes 230'. The protective film may include an inorganic material such as silicon oxide, silicon nitride, silicon oxynitride, or the like.

Figure 8:
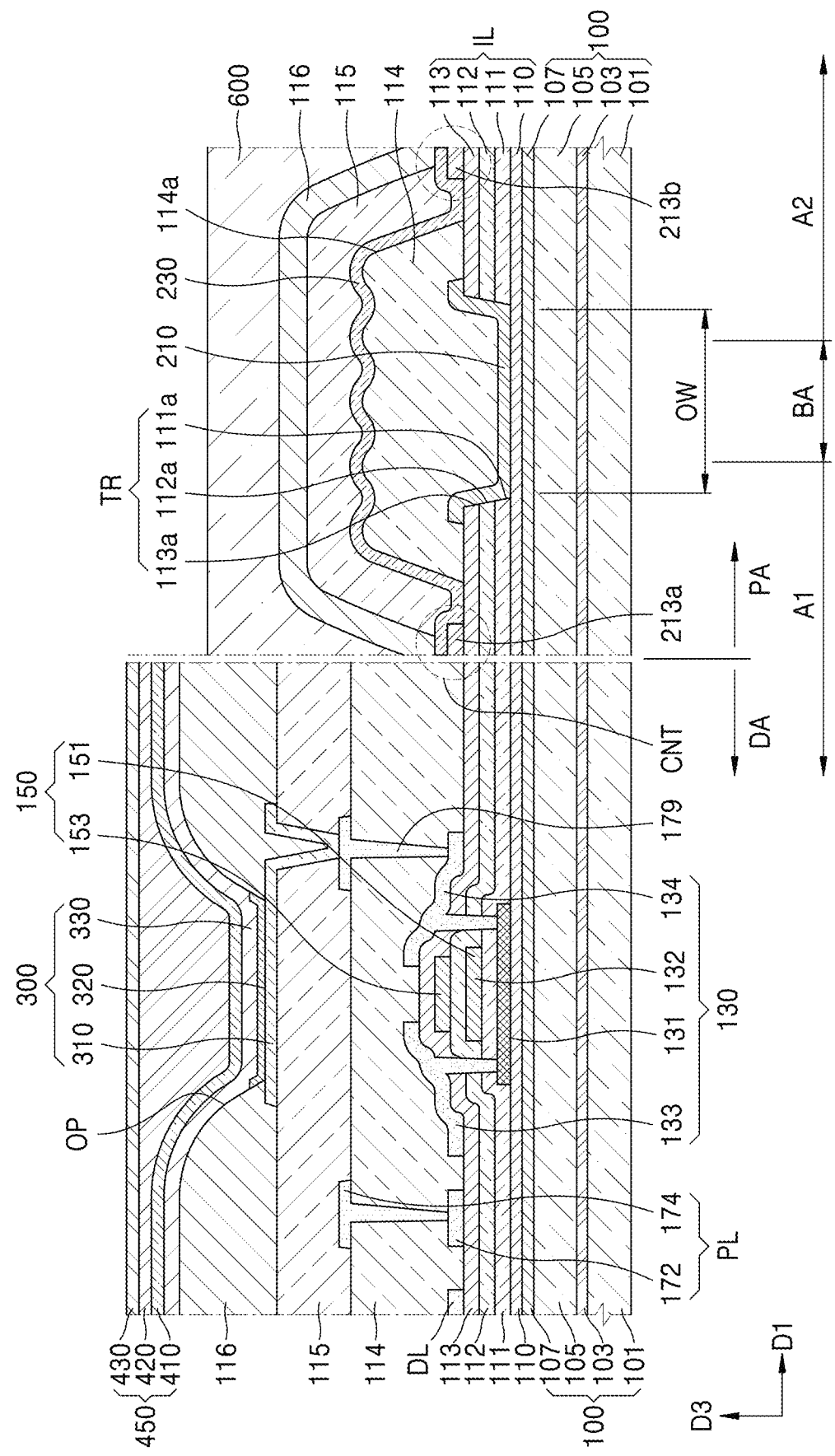
FIG. 8 is a schematic cross-sectional view of a portion of the display device in FIG. 1 according to an embodiment.

FIG. 8 is a schematic cross-sectional view of a portion of the display device in FIG. 1 according to an embodiment. FIG. 8 is a cross-sectional view taken along line II-II' in FIG. 3 according to an alternative embodiment.

In an embodiment, as shown in FIG. 8, at least a portion of the upper surface of the fourth insulating layer 114 may be an uneven surface or a concave-and-convex surface 114a. Accordingly, a surface area of the upper surface of the fourth insulating layer 114 and a surface area of the upper and bottom surfaces of the first conductive layer 230 in an area corresponding to the trench TR may increase. As the upper surface of the fourth insulating layer 114 and the upper and bottom surfaces of the first conductive layer 230 have a large surface area, thereby reducing the tensile stress in the fourth insulating layer 114 and the upper and bottom surfaces of the first conductive layer 230 due to the bending of the substrate 100 or the like.

The first conductive layer 230 in contact with the concave-and-convex surface 114a of the fourth insulating layer 114 may also have a concave-and-convex shape. The bottom surface of the first conductive layer 230 may have a shape corresponding to the concave-and-convex surface 114a of the fourth insulating layer 114. In an embodiment, the upper surface of the first conductive layer 230 may have a shape corresponding to the concave-and-convex surface 114a of the fourth insulating layer 114.

In an alternative embodiment, the upper surface of the first conductive layer 230 may be an artificially formed concave-and-convex surface to have a concave-and-convex surface having a predetermined shape which does not correspond to the concave-and-convex surface 114a of the fourth insulating layer 114. In one embodiment, for example, a concave-and-convex surface may be artificially formed on the upper surface of the first conductive layer 230 by coating a photoresist on a conductive material layer, after forming the conductive material layer above the fourth insulating layer 114, and varying an exposure amount according to a region of the photoresist by using a slit mask, halftone mask, or the like to etch (remove) the conductive material layer. In other embodiments to be described below, the concave-and-convex surface may be artificially formed on the upper surface of the first conductive layer 230 as described above. Even in a process of artificially forming a concave-and-convex surface on the upper surface of the first conductive layer 230, the concave-and-convex surface of the first conductive layer 230 may be made to correspond the concave-and-convex surface 114a of the fourth insulating layer 114.

The concave-and-convex surface 114a of the fourth insulating layer 114 may be formed by various methods. In one embodiment, for example, the concave-and-convex surface 114a of the fourth insulating layer 114 may be formed by varying an exposure amount by using a slit mask, a halftone mask, or the like to etch (remove) a fourth insulating layer forming material. Herein, a portion being more etched may be a recessed portion of the concave-and-convex surface 114a. However, embodiments are not limited thereto. The concave-and-convex surface 114a of the fourth insulating layer 114 may be formed by using various methods such as removing only a particular portion of the fourth insulating layer forming material by a method such as dry etching or the like.

In another alternative embodiment, the concave-and-convex surface 114a may be formed on the fourth insulating layer 114 by a structure of the construction member 210 located below the fourth insulating layer 114. In one embodiment, for example, the construction member 210 may not have a single body structure in the bending area BA as shown in FIG. 6 and may include a plurality of patterns that are spaced apart from each other in the trench TR and in the periphery of the trench TR. The plurality of patterns may be located apart from each other in the first direction D1 and/or the second direction D2. The fourth insulating layer 114 covering the plurality of patterns may have the concave-and-convex surface 114a corresponding to an arrangement of the patterns. A portion corresponding to a gap between the plurality of patterns may be the recessed portion of the concave-and-convex surface 114a. Even when the concave-and-convex surface 114a is formed on the fourth insulating layer 114 in contact with the construction member 210 due to the transformed structure of the construction member 210, a process of artificially forming a concave-and-convex surface on the upper surface of the fourth insulating layer 114 may be further included.

Concave-and-convex surfaces of the fourth insulating layer 114 and the first conductive layer 230 shown in FIG. 8 may be applied to the embodiments described above with reference to FIGS. 5B and 5C.

Figure 9A:
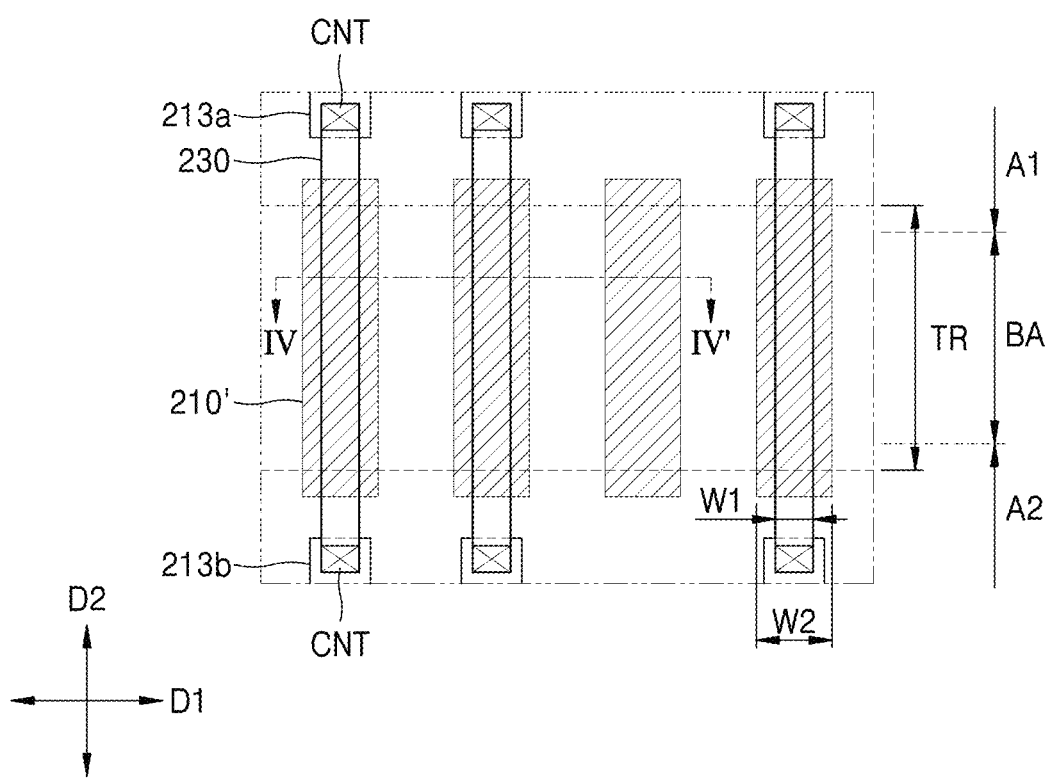
FIGS. 9A, 10A, and 11A are plan views showing structures of various embodiments of a construction member.
Figure 9B:
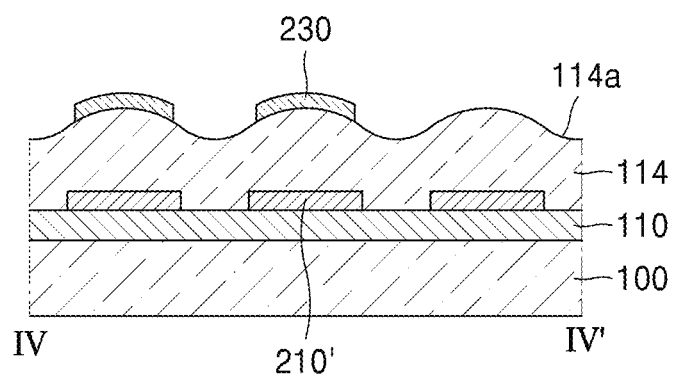
FIGS. 9B, 10B, and 11B are cross-sectional views respectively taken along lines IV-IV', V-V', and VI-VI' in FIGS. 9A, 10A, and 10B.
Figure 10A:
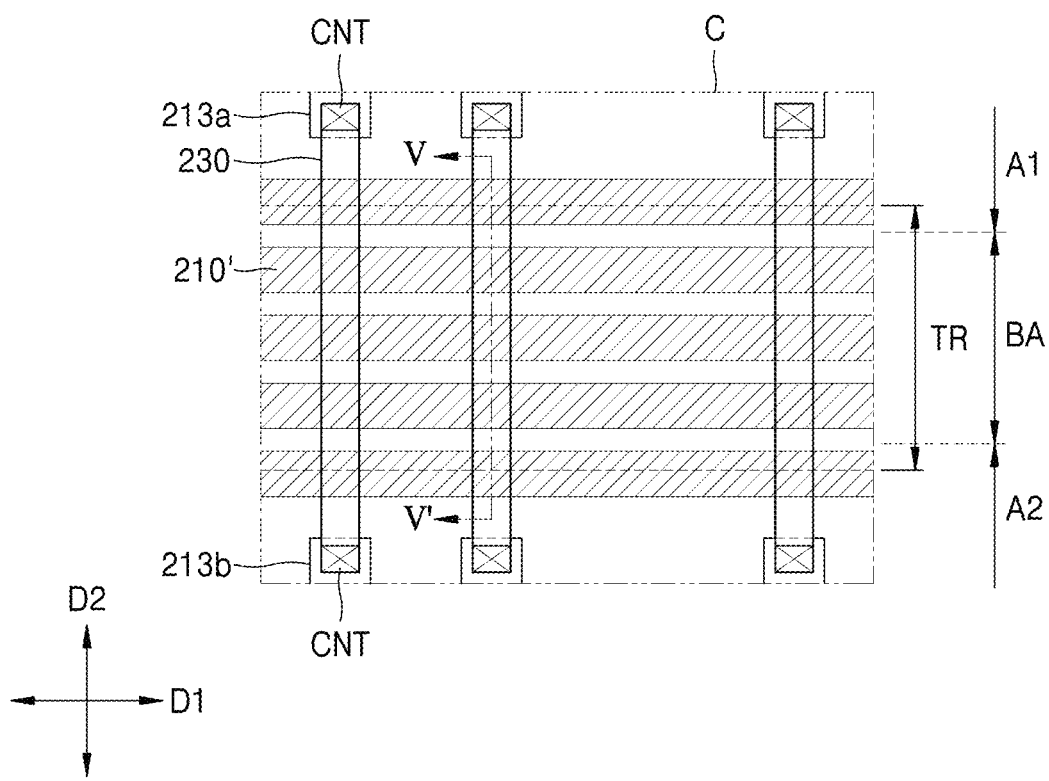
Figure 10B:
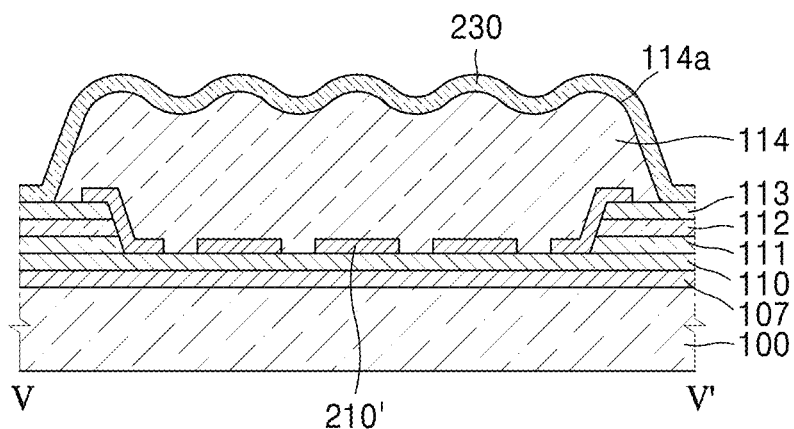
Figure 11A:
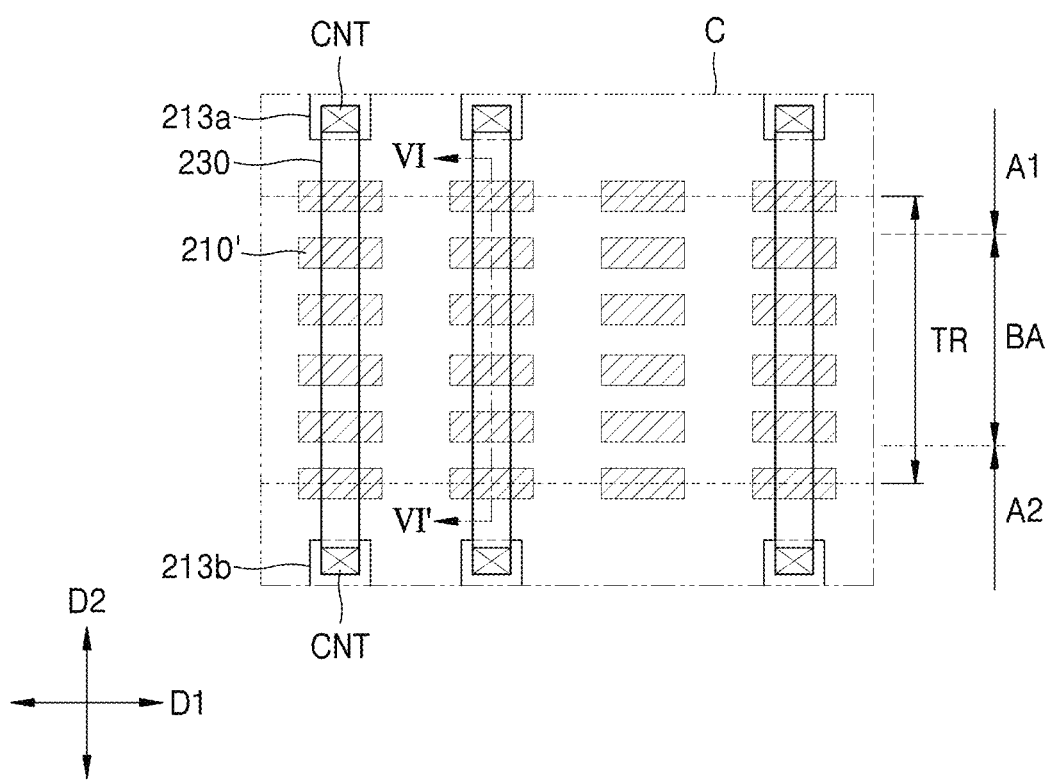
Figure 11B:
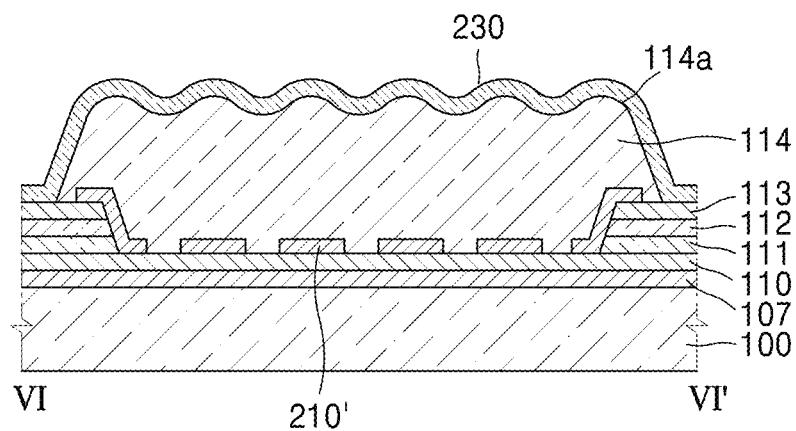

FIGS. 9A, 10A, and 11A are plan views showing structures of various embodiments of the construction member 210; and FIGS. 9B, 10B, and 11B are cross-sectional views respectively taken along lines IV-IV', V-V', and VI-VI' in FIGS. 9A, 10A, and 10B.

In an embodiment, as shown in FIGS. 9A and 9B, the construction member 210 may include a plurality of patterns 210' which are line-shaped floating patterns extending in the second direction D2 and having a predetermined width and length. The plurality of patterns 210' may be arranged parallel to each other at a predetermined interval in the first direction D1.

The plurality of patterns 210' may be covered by the fourth insulating layer 114 and the plurality of first conductive layer 230 may be formed on the fourth insulating layer 114. The plurality of first conductive layers 230 may extend in the second direction D2, be electrically connected to the second conductive layer 213a in the contact portion CNT in the first area A1, and be electrically connected to the third conductive layer 213b in the contact portion CNT in the second area A2. The first conductive layer 230 may overlap the plurality of patterns 210'. A width W1 of the first conductive layer 230 may be equal to or less than a width W2 of the pattern 210'.

The pattern 210' and the first conductive layer 230 may be in a one-to-one correspondence with each other and overlap each other. Only the plurality of patterns 210' may be provided in the bending area BA where the first conductive layer 230 is not located. The pattern 210' may be further provided in an area between the first conductive layers 230.

In an alternative embodiment, as shown in FIGS. 10A and 10B, the construction member 210 may include the plurality of patterns 210' which are line-shaped floating patterns extending in the first direction D1 and having a predetermined width and length. The plurality of patterns 210' may be arranged parallel to each other at a predetermined interval in the second direction D2.

The plurality of patterns 210' may be covered by the fourth insulating layer 114 and the plurality of first conductive layer 230 may be formed on the fourth insulating layer 114. The plurality of first conductive layers 230 may extend in the second direction D2, be electrically connected to the second conductive layer 213a in the contact portion CNT in the first area A1, and be electrically connected to the third conductive layer 213b in the contact portion CNT in the second area A2. The first conductive layer 230 may overlap the plurality of patterns 210'.

In another alternative embodiment, as shown in FIGS. 11A and 11B, the construction member 210 may include the plurality of patterns 210' which are island-shaped floating patterns. The plurality of patterns 210' may be arranged to be apart at predetermined intervals in a matrix form in the first direction D1 and the second direction D2. Although FIG. 11A illustrates an embodiment where the plurality of patterns 210' have a substantially rectangular shape, embodiments are not limited thereto. The shape of the plurality of patterns 210' may be variously changed or modified to have another shape such as a circular shape, an ellipse shape, a polygonal shape, a star shape, a diamond shape, or the like.

The plurality of patterns 210' may be covered by the fourth insulating layer 114 and the plurality of first conductive layer 230 may be formed on the fourth insulating layer 114. The plurality of first conductive layers 230 may extend in the second direction D2, be electrically connected to the second conductive layer 213a in the contact portion CNT in the first area A1, and be electrically connected to the third conductive layer 213b in the contact portion CNT in the second area A2. The first conductive layer 230 may overlap the plurality of patterns 210'.

Only the plurality of patterns 210' may be arranged to be apart from each other in a matrix form in the bending area BA where the first conductive layer 230 is not located. In another alternative embodiment, the plurality of patterns 210' may be further arranged between the first conductive layers 230.

In the embodiments shown in FIGS. 9A 10A, and 11A, as a distance between the first conductive layer 230 and the second conductive layer 213a decreases, a line width increases. Accordingly, an area where a portion of the first conductive layer 230 which is close to the second conductive layer 213a overlaps the pattern 210' is greater than an area where a portion of the first conductive layer 230 which is close to the third conductive layer 213b overlaps the pattern 210'.

As shown in FIGS. 9A, 10A, and 11A, the fourth insulating layer 114 covering the plurality of patterns 210' may have a concave-and-convex surface 114a on at least a portion of the upper surface to correspond to an arrangement of the plurality of patterns 210'. The first conductive layer 230 in contact with the concave-and-convex surface 114a of the fourth insulating layer 114 may also have a concave-and-convex shape. The bottom surface of the first conductive layer 230 may have a shape corresponding to the concave-and-convex surface 114a of the fourth insulating layer 114. In an embodiment, the upper surface of the first conductive layer 230 may have a shape corresponding to the concave-and-convex surface 114a of the fourth insulating layer 114. In an alternative embodiment, the upper surface of the first conductive layer 230 may have a predetermined-shaped concave-and-convex surface which does not correspond to the concave-and-convex surface 114a of the fourth insulating layer 114 by performing a process of forming an artificial concave-and-convex surface.

According to one or more embodiments, a display device may have a long life span with minimized defects such as disconnection during a manufacturing process. However, a scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising a display area and a peripheral area outside the display area, wherein the peripheral area comprises a bending area bent around a bending axis;
an inorganic material layer disposed on the substrate and having a trench corresponding to the bending area;
a construction member disposed in the trench of the inorganic material layer;
a first organic material layer directly covering the construction member; and
a conductive layer disposed on the first organic material layer,
wherein the construction member is insulated from the conductive layer.

2. The display device of claim 1, wherein the construction member has a board shape corresponding to the trench of the inorganic material layer.

3. The display device of claim 1, wherein the construction member comprises a plurality of patterns, each having a line shape extending in a first direction parallel to the bending axis and apart from each other in a second direction perpendicular to the first direction.

4. The display device of claim 1, wherein the construction member comprises a plurality of patterns, each having a line shape extending in a second direction perpendicular to a first direction parallel to the bending axis and apart from each other in the first direction.

5. The display device of claim 1, wherein the construction member comprises a plurality of patterns apart from each other in a first direction parallel to the bending axis and apart from each other in a second direction perpendicular to the first direction.

6. The display device of claim 1, wherein
the construction member comprises a same material as a data line disposed in the display area, and the conductive layer comprises a same material as a power supply voltage line disposed in the display area.

7. The display device of claim 1, further comprising: a second conductive layer and a third conductive layer, which are disposed on the inorganic material layer in the peripheral area and separated from each other by the trench of the inorganic material layer.

8. The display device of claim 7, wherein the conductive layer is connected to the second conductive layer and the third conductive layer.

9. The display device of claim 1, wherein an upper surface of the first organic material layer has a concave-and-convex shape.

10. The display device of claim 1, wherein upper and bottom surfaces of the conductive layer have concave-and-convex shapes.

11. The display device of claim 1, further comprising: a second organic material layer covering the conductive layer.

12. A display device comprising:
a substrate comprising a first area in which a pixel is disposed, a second area in which a driving unit is disposed, and a bending area between the first area and the second area;
an inorganic material layer disposed on the substrate in the bending area;
a construction member disposed on the inorganic material layer;
a first organic material layer directly covering the construction member; and
a conductive layer disposed on the first organic material layer and extending from the first area to the second area through the bending area.

13. The display device of claim 12, wherein the construction member has a board shape corresponding to the bending area.

14. The display device of claim 12, wherein the construction member extends in a second direction perpendicular to a first direction, in which the conductive layer extends, and comprises a plurality of patterns apart from each other in the first direction.

15. The display device of claim 12, wherein the construction member extends in a first direction, in which the conductive layer extends, and comprises a plurality of patterns apart from each other in a second direction perpendicular to the first direction.

16. The display device of claim 12, wherein the construction member comprises a plurality of patterns apart from each other in a first direction, in which the conductive layer extends, and apart from each other in a second direction perpendicular to the first direction.

17. The display device of claim 12, wherein an upper surface of the first organic material layer has a concave-and-convex shape.

18. The display device of claim 12, wherein upper and bottom surfaces of the conductive layer have concave-and-convex shapes.

19. The display device of claim 12, further comprising: a second organic material layer covering the conductive layer.

* * * * *